US007012811B1

(12) United States Patent
Jiang et al.

(10) Patent No.: US 7,012,811 B1
(45) Date of Patent: Mar. 14, 2006

(54) METHOD OF TUNING A MULTI-PATH CIRCUIT

(75) Inventors: Tongbi Jiang, Boise, ID (US); John Jacobson, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/568,156

(22) Filed: May 10, 2000

(51) Int. Cl.
*H05K 7/02* (2006.01)
*H05K 7/06* (2006.01)
*H05K 7/08* (2006.01)
*H05K 7/10* (2006.01)

(52) U.S. Cl. .................. 361/777; 361/778; 257/774; 257/775

(58) Field of Classification Search .............. 361/728, 361/777–778, 786, 720, 760–761, 748, 772, 361/803, 764, 750–751, 775, 794–795, 808, 361/774; 174/260, 261, 250; 257/774–775, 257/635, 637, 700
See application file for complete search history.

(56) References Cited

U.S. PATENT DOCUMENTS

| | | | |
|---|---|---|---|
| 4,451,326 A | 5/1984 | Gwozdz | |
| 4,734,156 A | 3/1988 | Iwasa | |
| 4,743,568 A | 5/1988 | Wood | |
| 4,869,767 A | 9/1989 | Robinson et al. | |
| 4,956,694 A * | 9/1990 | Eide | 357/74 |
| 5,055,426 A | 10/1991 | Manning | |
| 5,241,456 A * | 8/1993 | Marcinkiewicz et al. | 361/792 |
| 5,260,892 A | 11/1993 | Testa | |
| 5,459,287 A * | 10/1995 | Swamy | 174/266 |
| 5,468,995 A * | 11/1995 | Higgins, III | 257/697 |
| 5,530,288 A * | 6/1996 | Stone | 257/700 |
| 5,763,947 A * | 6/1998 | Bartley | 257/701 |
| 5,796,746 A * | 8/1998 | Farnworth et al. | 714/718 |
| 5,838,549 A * | 11/1998 | Nagata et al. | 361/794 |
| 5,851,913 A | 12/1998 | Brennan et al. | |
| 5,852,870 A | 12/1998 | Freyman et al. | |
| 5,937,515 A * | 8/1999 | Johnson | 29/847 |
| 5,955,889 A * | 9/1999 | Taguchi et al. | 326/30 |
| 6,051,890 A * | 4/2000 | Mozdzen | 257/784 |
| 6,154,851 A * | 11/2000 | Sher et al. | 714/5 |
| 6,201,194 B1 * | 3/2001 | Lauffer et al. | 174/264 |
| 6,278,181 B1 * | 8/2001 | Maley | 257/712 |
| 6,366,466 B1 * | 4/2002 | Leddige et al. | 174/261 |
| 6,424,034 B1 * | 7/2002 | Ahn et al. | 257/723 |
| 6,661,316 B1 * | 12/2003 | Hreish et al. | 333/246 |

* cited by examiner

*Primary Examiner*—Amir Zarabian
*Assistant Examiner*—Thanh Y. Tran
(74) *Attorney, Agent, or Firm*—Dickstein Shapiro Morin & Oshinsky LLP

(57) ABSTRACT

An improved method for reducing timing skew for signals, for example clock signals, that propagate along a circuit board, for example, a memory module, is disclosed. At least one signal trace of a plurality of traces provided on the printed circuit board (PCB) is routed in both a horizontal and a vertical direction such that its path length is substantially the same as the path length of another of said plurality of traces.

32 Claims, 5 Drawing Sheets

METHOD OF TUNING A MULTI-PATH CIRCUIT

FIELD OF THE INVENTION

The present invention relates to the field of printed circuit boards (PCB) and, in particular, to an improved method for reducing timing skew by adjusting the length of signal traces on a printed circuit board.

BACKGROUND OF THE INVENTION

As integrated circuits become faster, eliminating timing skew (or signal arrival time) among signals propagating along high speed printed circuit boards becomes increasingly important. Many techniques have been proposed for handling timing skew, but they all involve substantial costs and/or complex manufacturing techniques.

For example, U.S. Pat. No. 5,260,892 describes a method and apparatus for manufacturing an improved Dynamic Random Access Memory ("DRAM") electrical signal interconnect structure having special application to Single In-Line Memory Modules ("SIMMs"). The structure contains an on-board buffer for deriving time-critical signals from a single source. The conductor structure further includes trace signal routes that allow for approximately equivalent minimum distance signal line lengths. The device further includes vias connecting the front and rear surfaces of the SIMMs, resulting in a high speed, high density SIMM with clean rising and falling edges. The conduction pattern, however, has to be carefully laid out and is therefore relatively expensive to implement.

Accordingly, there is a need for an improved method and system that will reduce the timing skew for signals, such as clock or data signals, propagating along a printed circuit board, such as one used in a memory module. There is also needed a new and improved method that will reduce the cost of production and manufacture of memory modules, as well as a method and system that will allow more relaxed tolerances in the manufacture of such memory modules.

SUMMARY OF THE INVENTION

The present invention provides an improved method and structure for reducing timing skew for signals, for example clock and/or data signals, that propagate along a printed circuit board, such as a printed circuit board used in a memory module, for example, a DRAM, SRAM, or SDRAM memory module. The method of the present invention adjusts the length of signal traces on the printed circuit board (PCB). The signal trace adjustment is accomplished by tuning the signal path length in both a vertical and a horizontal direction using vias, metal lines and/or conductors in different layers of the printed circuit board. This vertical/horizontal tuning can be used to reduce timing skew of clock and other module signals, thereby increasing module timing margins and performance.

The foregoing and other advantages and features of the invention will be better understood from the following detailed description of the invention, which is provided in connection with the accompanying drawings.

DETAILED DESCRIPTION OF THE DRAWINGS

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The present invention provides a method for reducing timing skew for signals propagating along a printed circuit board, for example, along a printed circuit board used as a memory module, such as a DRAM, SRAM, or SDRAM memory module. As will be described in more detail below, the method of the present invention adjusts the length of signal traces of a printed circuit board (PCB) of the memory module by tuning the signals in both a vertical and a horizontal manner, through vias and metal lines or structures of different multilayers of the module. This vertical/horizontal tuning further reduces timing skew of clock and other module signals, thereby increasing module timing margins and performance.

Figure 1:
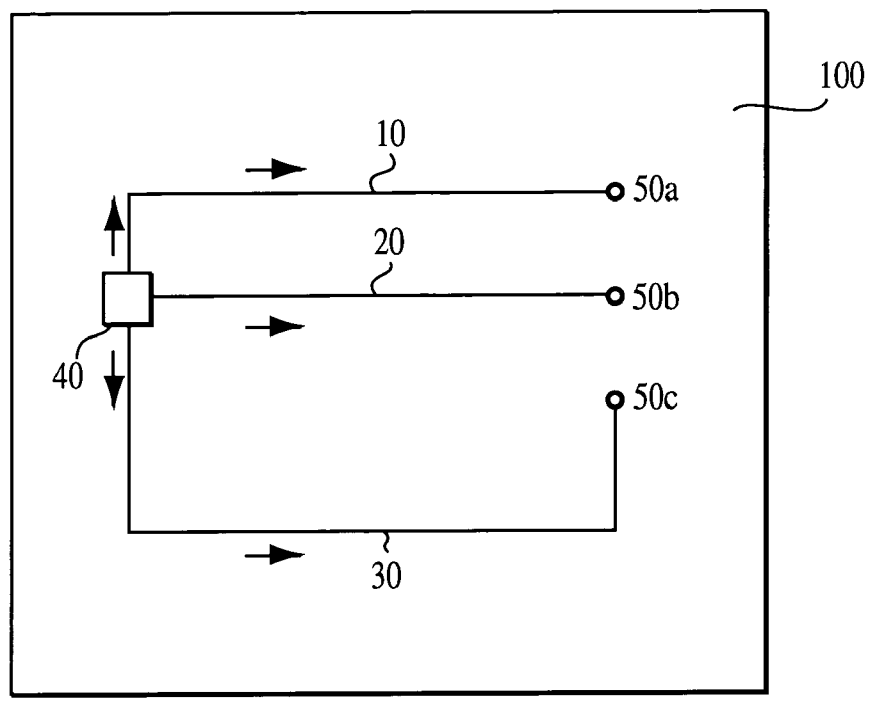
FIG. 1 is a perspective illustration of a portion of a printed circuit board (PCB) containing signal traces prior to skew adjustment.

Referring now to the drawings, where like elements are designated by like reference numerals, FIG. 1 illustrates a portion 100 of a conventional memory module printed circuit board (PCB) having a conductor pattern with three signal traces, 10, 20, and 30 between a signal origination location 40 and a plurality of signal termination locations 50a, 50b, 50c. In a memory module, the origination location 40 might be a clock input terminal and the signal terminal locations 50a, 50b, 50c might be clock input terminals of respective integrated circuits which require a clock input signal. As illustrated in FIG. 1, the signal trace 10, 20, and 30 have different lengths, with signal trace 20 being the shortest path between the signal origination location 40 and the signal termination location 50b, and signal trace 30 being the longest path between the signal origination location 40 and the signal termination location 50c.

Because the trace lengths have varying lengths, signal arrival time (also called skew) at the signal termination locations 50a, 50b, 50c will vary accordingly. For example, the time that will take an electrical signal to propagate through trace 30 will be longer than the time that will take the same signal to propagate through trace 10 or 20. Likewise, the time that will take an electrical signal to propagate through trace 10 will be longer than the time that will take the same signal to propagate through trace 20. To correct the signal arrival time at the signal termination locations 50a, 50b, 50c, for example, the arrival time of a clock signal, the conductive path length may be altered on the PCB, so that the timing skew can be reduced or even eliminated.

Time domain transmission techniques are used in the industry to determine how to adjust the PCB trace length, in particular, how to determine the amount of signal adjustment needed for a particular circuit path. For this, in-phase pulses are launched into a known reference trace, as well as into a PCB trace-under-test. Such pulses can originate from a single pulse source, which may include a signal splitter to produce two identical in-phase pulses.

Figure 2:
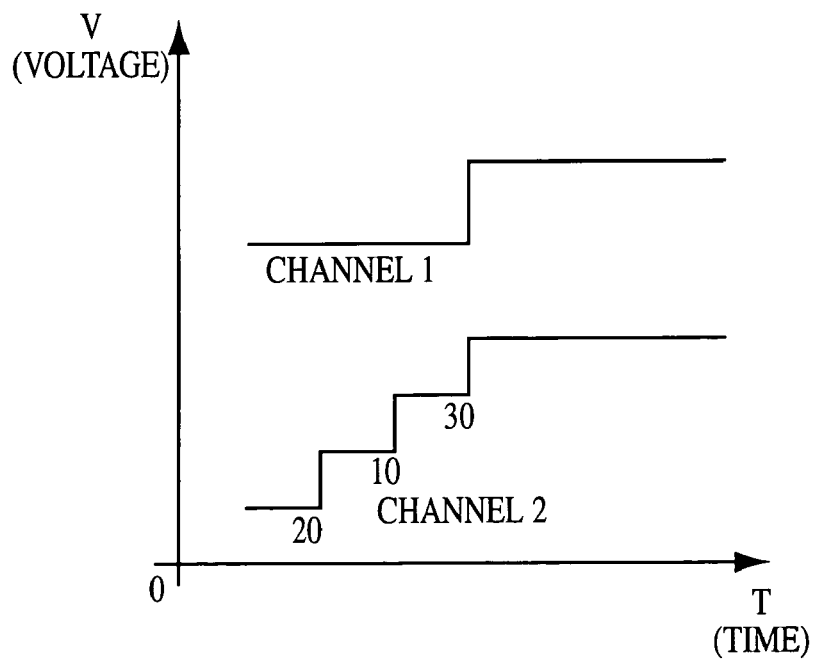
FIG. 2 is an oscilloscope display showing timing skew measurements.

FIG. 2 illustrates a timing diagram as shown on an oscilloscope connected to an output of a reference trace path (channel 1) and a trace path on the PCB (channel 2). The channel 1 signal represents the timing signal received by an oscilloscope traveling through the reference path, while the channel 2 signal represents the same timing signal, but passing through the PCB traces 10, 20, and 30, respectively. As represented in FIG. 2, when the signal that is being measured passes through section 30, the signal under test best matches the arrival time of the reference signal on channel 1. However, when the signal under test passes through section 20, the signal under test arrives much sooner than the reference signal. Likewise, when the signal under test passes through section 10, the signal under test also arrives sooner than the reference signal. Thus, it is evident that the longest trace 30 on the PCB produces the largest signal delay, while the shortest trace 20 produces the shortest signal delay, with the trace 10 falling in between. It is also evident that the trace 30 is the closest match to providing a signal arrival time that corresponds with the arrival time of the reference signal. Thus, paths 10 and 20 can be lengthened to equal the path length of trace 30 to ensure that signals on all paths arrive at their destinations at substantially the same time.

Figure 3:
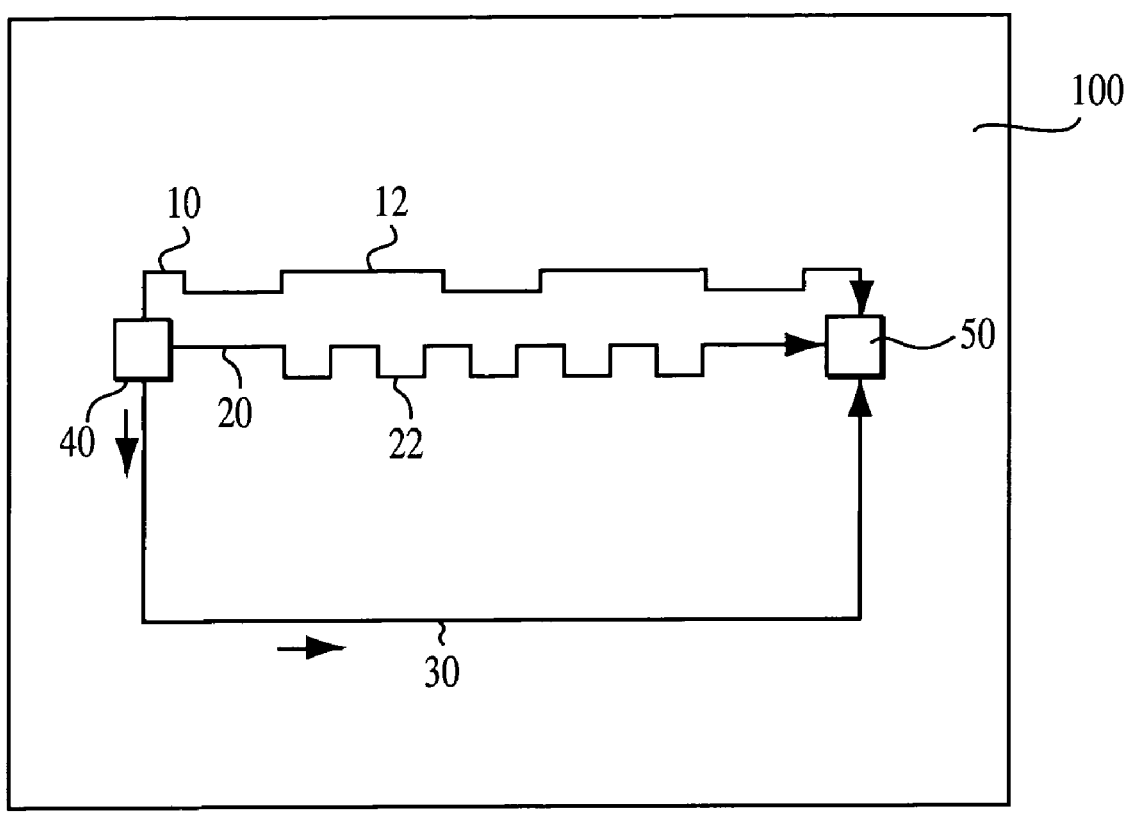
FIG. 3 is a perspective illustration of a portion of a printed circuit board (PCB) containing signal traces after trace length adjustment, in accordance with the prior art.

As known in the art, the length of the signal traces can be reduced or increased by adjusting the routing of their corresponding lines, as shown in FIG. 3. The routing adjustment is done on a horizontal plane of the same layer of the portion 100 of the PCB containing the trace. Because trace 30 is the longest trace of the three traces of FIG. 1, only traces 10 and 20 must be lengthened, as shown in FIG. 3. This way, signal path adjustment section 12 (corresponding to signal trace 10) and signal path adjustment section 22 (corresponding to signal trace 20) minimize or eliminate the timing skew. Electrical signals propagating through any one of the traces 10, 20, or 30 will accordingly have substantially equal signal arrival times at the signal termination locations 50a, 50b, 50c.

Although the signal path length adjustments described above reduce the timing skew, the technology employed has a major drawback, that is the etching of the signal path adjustment sections 12 and 22 with fine spacing. When signal traces are extremely small, for example 75 microns wide and 75 microns apart, it is difficult to pattern these fine lines, particularly with available etching techniques. Because of limitations posed by the etching process, the metal conductor patterns which can be produced to adjust path length greatly limit the overall density and reliability of interconnections among various locations on a same level of a PCB.

Figure 4:
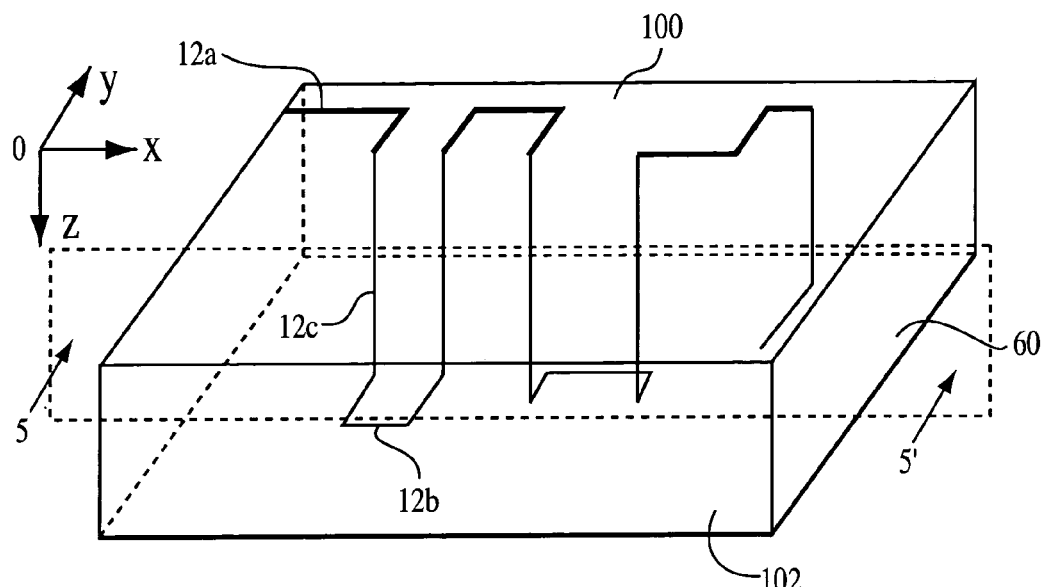
FIG. 4 is a perspective view of a portion of a printed circuit board (PCB) depicting signal traces after trace length adjustment, and in accordance with a method of the present invention.
Figure 5:
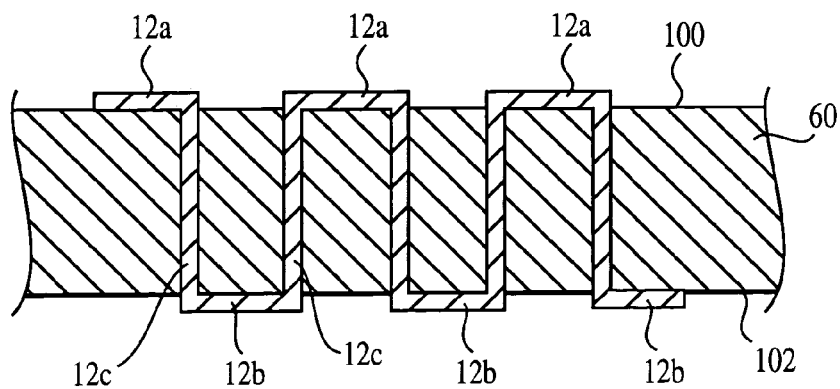
FIG. 5 is a cross-sectional view of the printed circuit board (PCB) of FIG. 4, taken along line 5—5'.
Figure 6:
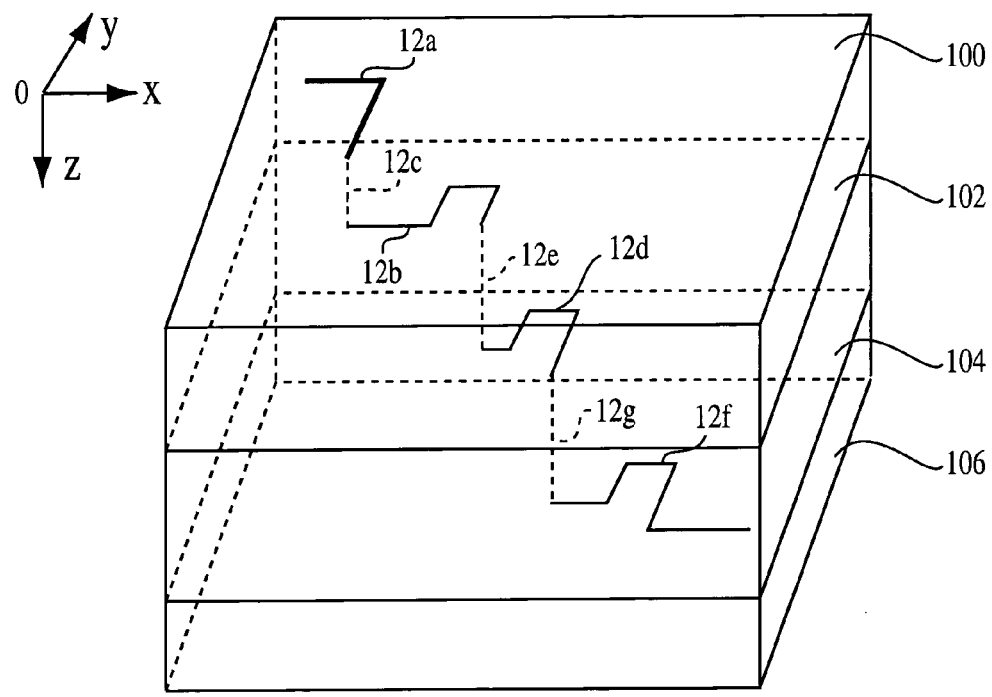
FIG. 6 is a perspective view of a portion of a multilayer printed circuit board (PCB) depicting signal traces after trace length adjustment, and in accordance with a method of the present invention.

The present invention provides an improved method for reducing timing skew for signals on a PCB, by tuning the signal paths in both vertical and horizontal planes, as illustrated in FIGS. 4–6.

FIG. 4 is a perspective view of a portion of a printed circuit board (PCB) 60 that contains a signal path which has been tuned according to the present invention. The portion of the PCB 60 depicted in FIG. 4 has a top surface 100 and a bottom surface 102 on which a signal trace can be routed. As shown in FIG. 4, the signal trace can be routed in the X and Y directions on each of the surfaces 100 and 102, and in the Z direction between surfaces 100 and 102.

FIG. 5 depicts a cross-sectional view of the portion of the PCB 60 of FIG. 4, taken along plane 5—5'. FIG. 5 depicts the electrically conductive signal path section 12 (corresponding to signal trace 10 of FIG. 3) formed on the PCB substrate 60. The signal path section 12 consists of horizontal segments 12a (FIG. 5) formed on the top surface 100 of the PCB substrate 60, and horizontal segments 12b formed on the bottom surface 102 of the PCB substrate 60. The horizontal segments 12a and 12b are interconnected with vertical segments 12c. As evident in FIG. 4, the horizontal segments 12a and 12b can propagate in one or both of the X and Y axis directions, while the vertical segments 12c can propagate in the Z axis direction.

The PCB substrate 60 is typically a PCB laminate, such as FR-4, polyimide/glass, Teflon/glass, or equivalents. An inorganic substrate, such as alumina ceramic or glass, for example, may also be used to form the PCB substrate 60.

The signal traces are typically fabricated from copper, nickel, aluminum, gold, or combinations thereof. Various methods and techniques for forming signal traces on planar surfaces are known and used in the art. For example, a common technique for forming the metal planar pattern employs patterning and etching of signal traces on the substrate by using standard electroplating or additive methods. In one embodiment, a layer of metal, typically on the order of 2 to 30 microns, is deposited on the PCB substrate 60, after which this layer is transformed into the signal traces 12a and 12b (FIG. 5) by appropriate etching, photolithography or etching steps.

Before or after the formation of the signal traces 12a and 12b (FIG. 5), a plurality of interconnections, commonly known as vias, are formed into the PCB substrate 60 to properly interconnect the traces on both surfaces of the substrate. As well-known in the art, a typical method for forming vertical conductive paths, such as signal trace 12c, between metal layers consists of first drilling holes into the PCB substrate 60 to form vias, followed by plating interconnections in the vias. This way, signal path section 12 of the signal trace 10 (FIG. 3) consists of both horizontal and vertical structures, which can be designed to have an appropriate path length to minimize signal skews among different circuit paths on the printed circuit board. The vertical/horizontal wiring of the signal path also affords a greater planar working area, since tuning according to the present invention takes up less of the planar area and more of the vertical area. Of course, the same tuning processing steps could be applied to any or all of the exemplary signal paths 10, 20, 30 shown in FIG. 3.

Although the embodiment described above refers to only one signal trace routed on a PCB with two surfaces, it is to be understood that the present invention contemplates the use of a plurality of signal traces, each of which may have a path length set by routing the trace in the X, Y axis directions of the surfaces of the board, and vertically in the Z axis direction through the board. Further, although the present invention has been described as using both the signal origination location 40 and the signal termination locations 50a, 50b, 50c on same top planar surface 100 of the PCB 60, it must be understood that the invention is not limited by the above embodiment, and the origination and termination locations could be situated on different surfaces 100, 102 of the PCB 60.

In must be further understood that, although the embodiment described above refers to signal traces routed on a PCB with two surfaces, the present invention also contemplates the use of a PCB with a plurality of layers, and, therefore, with a plurality of surfaces on which the signal traces could be routed. For example, the portion of a PCB depicted in FIG. 6 has three adjacent layers that are defined by a top surface 100, a bottom surface 106, and intermediate surfaces 102 and 104, respectively. As shown in FIG. 6, the signal trace can be routed in the X and Y directions of each of the surfaces 100, 102, 104, and 106, and in the Z direction between surfaces 100, 102, 104, and 106.

FIG. 6 depicts the electrically conductive signal path 12 (corresponding to signal trace 10 of FIG. 3), which consists of horizontal segments 12a, 12b, 12d, and 12f formed on the top surface 100, the intermediate surfaces 102 and 104, and on the bottom surface 106. The horizontal segments 12a, 12b, 12d, and 12f are interconnected with vertical segments 12c, 12e, and 12g. As evident in FIG. 6, the horizontal segments 12a, 12b, 12d, and 12f can propagate in one or both of the X and Y axis directions, while the vertical segments 12c, 12e, and 12g can propagate in the Z axis direction.

Although the embodiment described above refers to a PCB with only three adjacent layers, it must be understood that the present invention is not limited by the above embodiment, and the PCB can consist of any number of adjacent intermediate layers with their corresponding horizontal surfaces, on which signal trace routing could be performed according to the present invention.

Figure 7:
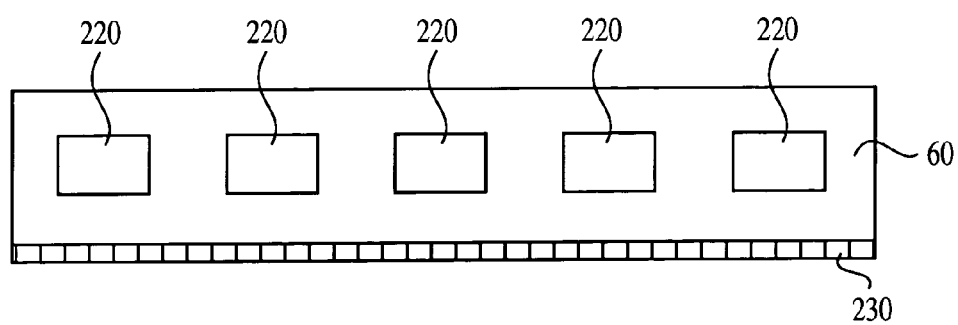
FIG. 7 illustrates a conventional SIMM that uses a printed circuit board constructed according to the present invention.

The PCB 60 containing signal paths formed according to the present invention could further be part of a module which mounts various integrated circuit (IC) chips. For example, FIG. 7 shows a conventional memory module 210, such as a SIMM or a Multi Chip Module (MCM), for example, that includes PCB substrate 60 and data memory chips 220. An edge connector 230 connects a plurality of clock, address and data signals from an external computer to the data memory chips 220 via connecting traces on the PCB substrate 60 and the memory chips 220 are connected themselves in circuit on the PCB 60. The manner in which memory chips 220 are wired on the PCB substrate 60 is well known in the art. In the present invention, the wiring pattern on the PCB substrate 60 contains conductor signal traces for the clock signal having path lengths configured as described above with reference to FIGS. 4–6.

Figure 8:
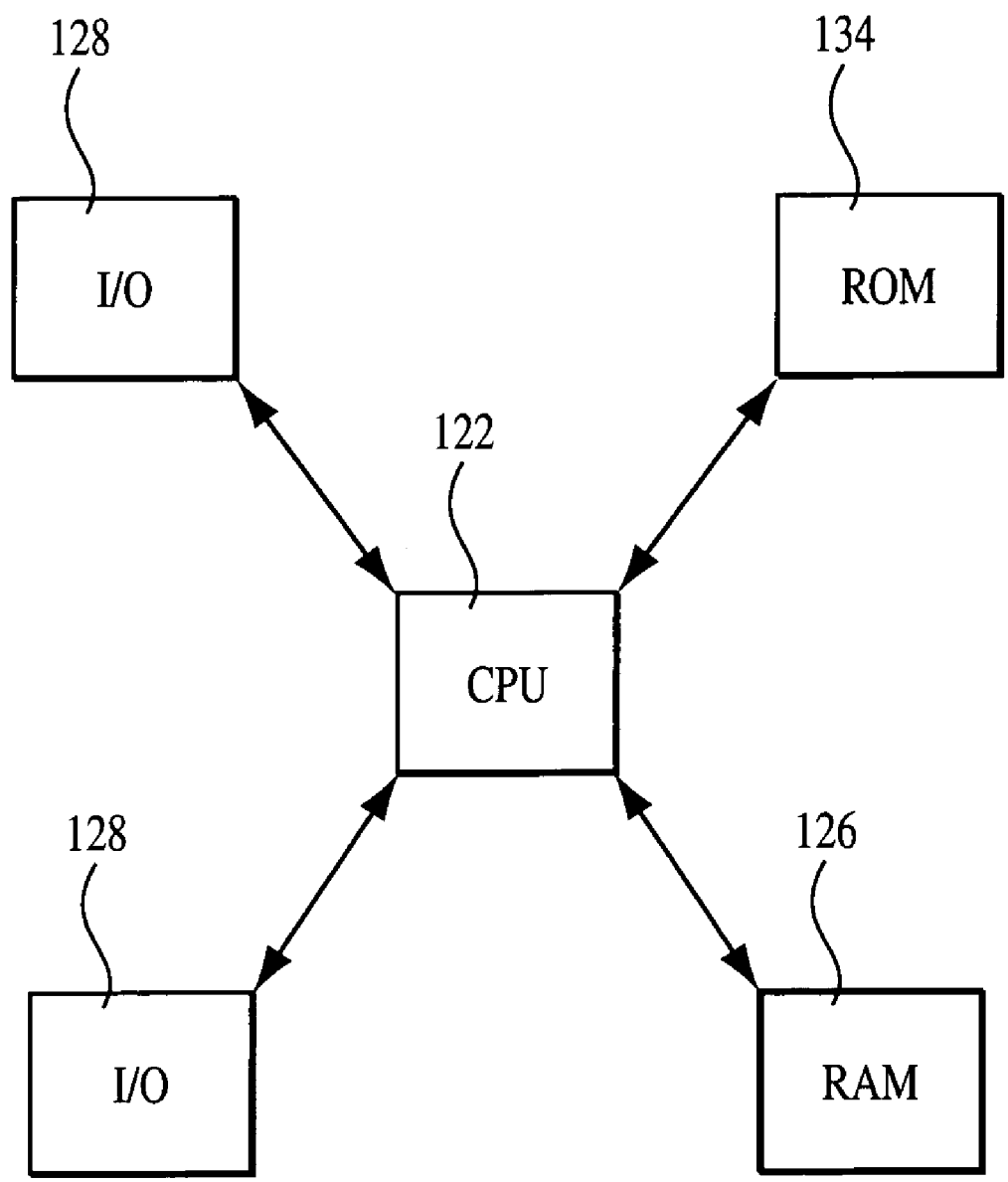
FIG. 8 is an illustration of a computer system having a memory module with signal traces adjusted according to the present invention.

The method of reducing the timing skew of the present invention has particular utility in a memory module used in a computer system, such as the one illustrated in FIG. 8. A processor, such as a CPU 122, of a computer system is interconnected with a ROM 134, RAM 126, and one or more I/O ports 128 which connect with I/O devices, such as a keyboard, display, mouse, hard drive, or floppy drive. The RAM 126 may be formed of one or more PCB of a memory module, on which the length of the signal traces has been adjusted in the manner describe above in connection with FIGS. 3–6. It is also possible to use the invention on a motherboard which mounts the CPU 122.

It should be noted that, although the invention has been explained with reference to FIG. 2 which shows the signal traces 10, 20, 30 as having a common origination, the invention is also equally applicable to signal traces which have respective signal originations, the important aspect of the invention being the use of upper and lower surfaces and vias in a printed circuit board layer to route one or more signal traces in the X, Y directions on both surfaces, and in the Z direction between surfaces, to achieve substantially the same signal path length as other traces to reduce timing skew.

Although the present invention has been described with specific reference to memory circuits, the invention has broader applicability and may be used in with any printed circuit board to reduce timing skew by setting an appropriate signal trace length. The above description and drawings are only illustrative of preferred embodiments which achieve the features and advantages of the present invention. It is not intended that the present invention be limited to the illustrated embodiments. Modifications and substitutions can be made without departing from the spirit and scope of the present invention. Accordingly, the present invention is not to be considered as being limited by the foregoing description and drawings, but is only limited by the scope of the appended claims.

What is claimed as new and desired to be protected by Letters Patent of the United States is:

1. A method of reducing skew on a circuit board, said method comprising:
   routing a plurality of conductive traces on said circuit board from first location to second locations, at least one of said conductive traces extending along first and second surfaces of said circuit board and through said circuit board; and
   obtaining data representative of timing skew and determining a path for said at least one of said conductive traces to reduce said timing skew, and wherein said determining step occurs subsequent to said data obtaining step.

2. The method of claim 1 further comprising the step of routing at least one of said plurality of said conductive traces so that a path length of said at least one conductive trace substantially equals a path length of another of said conductive traces.

3. The method of claim 1, wherein said circuit board comprises a plurality of layers, and wherein said step of routing said plurality of conductive traces further comprises routing said at least one of said plurality of traces on surfaces of said plurality of layers and through said plurality of layers.

4. The method of claim 3, wherein said circuit board comprises three layers, and wherein said step of routing said plurality of conductive traces further comprises routing at least one of said plurality of traces on surfaces of said three layers and through said three layers.

5. The method of claim 1, wherein said circuit board is part of a memory module.

6. The method of claim 5, wherein said memory module is a DRAM memory module.

7. The method of claim 5, wherein said memory module is a SRAM memory module.

8. The method of claim 5, wherein said memory module is a SDRAM memory module.

9. The method of claim 5, wherein said memory module is a MCM memory module.

10. A printed circuit board comprising:
    a substrate comprising a plurality of layers; and
    a plurality of signal traces provided on said substrate, at least one of said signal traces extending along a top and bottom surface of said printed circuit board and through said plurality of layers, said at least one of said signal traces having a path length which provides minimal signal skew relative to other path lengths of said plurality of signal traces.

11. The printed circuit board of claim 10, wherein said at least one of said conductive traces provides a signal path length which is substantially equal to a signal path length of another of said conductive traces.

12. The printed circuit board of claim 10, wherein said substrate comprises three layers, said at least one of said signal traces being routed on surfaces of said three layers and through said three layers.

13. The printed circuit board of claim 10, wherein said printed circuit board is part of a memory module.

14. The printed circuit board of claim 13, wherein said memory module is a DRAM memory module.

15. The printed circuit board of claim 13, wherein said memory module is a SRAM memory module.

16. The printed circuit board of claim 13, wherein said memory module is a SDRAM memory module.

17. The printed circuit board of claim 13, wherein said memory module is a MCM memory module.

18. A memory module comprising:
a printed circuit board comprising a top surface and a bottom surface; and
a conductive pattern formed on said printed circuit board as a plurality of circuit board, signal traces, at least one of said signal traces being routed on said top surface, on said bottom surface, and through said printed circuit board, said at least one of said signal traces having a path length which provides minimal skew relative to other path lengths of said plurality of circuit board signal traces, said at least one of said traces providing a signal path length which is substantially equal to a signal path length of another of said plurality of traces.

19. The memory module of claim 18, wherein said printed circuit board layer comprises a plurality of layers, said plurality of conductive traces being further routed on surfaces of said plurality of layers and through said plurality of layers.

20. The memory module of claim 19, wherein said printed circuit board layer comprises three layers, said plurality of conductive traces being further routed on surfaces of said three layers and through said three layers.

21. The memory module of claim 18, wherein said memory module is a DRAM.

22. The memory module of claim 18, wherein said memory module is a SRAM.

23. The memory module of claim 18, wherein said memory module is a SDRAM.

24. The memory module of claim 18, wherein said memory module is a MCM.

25. A computer system comprising:
a processor; and
at least one memory module connected to said processor, at least one of said memory module and processor being mounted to a printed circuit board which comprises a plurality of conductive signal traces, at least one of said conductive signal traces extending along a top and bottom surface of said printed circuit board and through said printed circuit board, said at least one of said conductive signal traces having a path length which provides minimal skew relative to other path lengths of said plurality of conductive signal traces.

26. The computer system of claim 25, wherein said at least one of such conductive traces provides a signal path length which substantially equals a path length of another of said conductive traces.

27. The computer system of claim 25, wherein said printed circuit board further comprises a plurality of layers, at least one of said conductive traces being routed on surfaces of said plurality of layers and through said plurality of layers.

28. The computer system of claim 27, wherein said printed circuit board comprises three layers, at least one of said conductive traces being routed on surfaces of said three layers and through said three layers.

29. The computer system of claim 25, wherein said memory module is a DRAM memory module.

30. The computer system of claim 25, wherein said memory module is a SRAM memory module.

31. The computer system of claim 25, wherein said memory module is a SDRAM memory module.

32. The computer system of claim 25, wherein said memory module is a MCM memory module.

* * * * *